US007135941B1

(12) United States Patent
Tsironis

(10) Patent No.: US 7,135,941 B1
(45) Date of Patent: Nov. 14, 2006

(54) TRIPLE PROBE AUTOMATIC SLIDE SCREW LOAD PULL TUNER AND METHOD

(75) Inventor: Christos Tsironis, 1603 St. Regis, c/o Focus Microwaves Inc., D.D.O., Québec (CA) H9B-3H7

(73) Assignee: Christos Tsironis, Kirkland (CA)

( * ) Notice: Subject to any disclaimer, the term of this patent is extended or adjusted under 35 U.S.C. 154(b) by 23 days.

(21) Appl. No.: 10/851,797

(22) Filed: May 24, 2004

(51) Int. Cl.
*H03H 7/38* (2006.01)
*G01R 27/00* (2006.01)

(52) U.S. Cl. ...................... 333/17.3; 333/263; 324/642

(58) Field of Classification Search .................. 324/76, 324/49, 76.11, 76.51, 642, 17.3, 263; 333/17.3, 333/263
See application file for complete search history.

(56) References Cited

U.S. PATENT DOCUMENTS 6,674,293 B1 1/2004 Tsironis

FOREIGN PATENT DOCUMENTS

JP 2000221233 A * 8/2000

OTHER PUBLICATIONS

Browne, "Coaxial Tuners Conrol Impedances to 65 GHz", Jan. 2003, Microwaves and RF.*

Christos Tsironis, Product Note #41: Computer Controlled Microwave Tuner, CCMT, Focus Microwaves Inc., Jan. 1998.

Christos Tsironis, "System Performs Active Load-Pull Measurements", Microwaves & RF, Nov. 1995, p. 102, 104, 106, 108.

Maury Microwave Corp., Precision Microwave Instruments and Components Product Catalogue 2001, p. 158.

* cited by examiner

*Primary Examiner*—Stephen E. Jones

(57) ABSTRACT

An automatic, electromechanical microwave tuner, used for load pull transistor testing, employs three horizontally and vertically adjustable RF probes; the tuner creates very low mechanical vibrations, because it is capable of generating all microwave reflection factors required for complete load pull and noise measurement operations, using only vertical probe movement; it also provides high tuning dynamic range, large frequency bandwidth and continuous choice of tuning target areas.

6 Claims, 25 Drawing Sheets
(4 of 25 Drawing Sheet(s) Filed in Color)

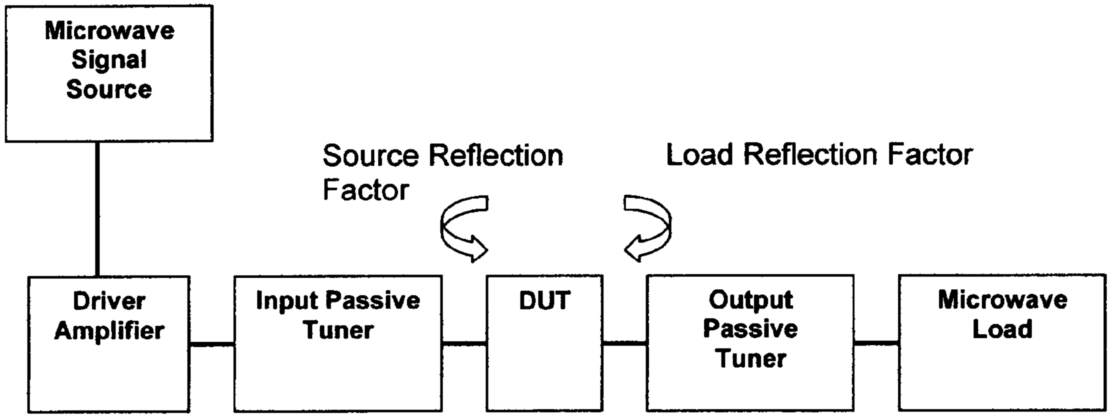
*Figure 1 – Prior Art -*

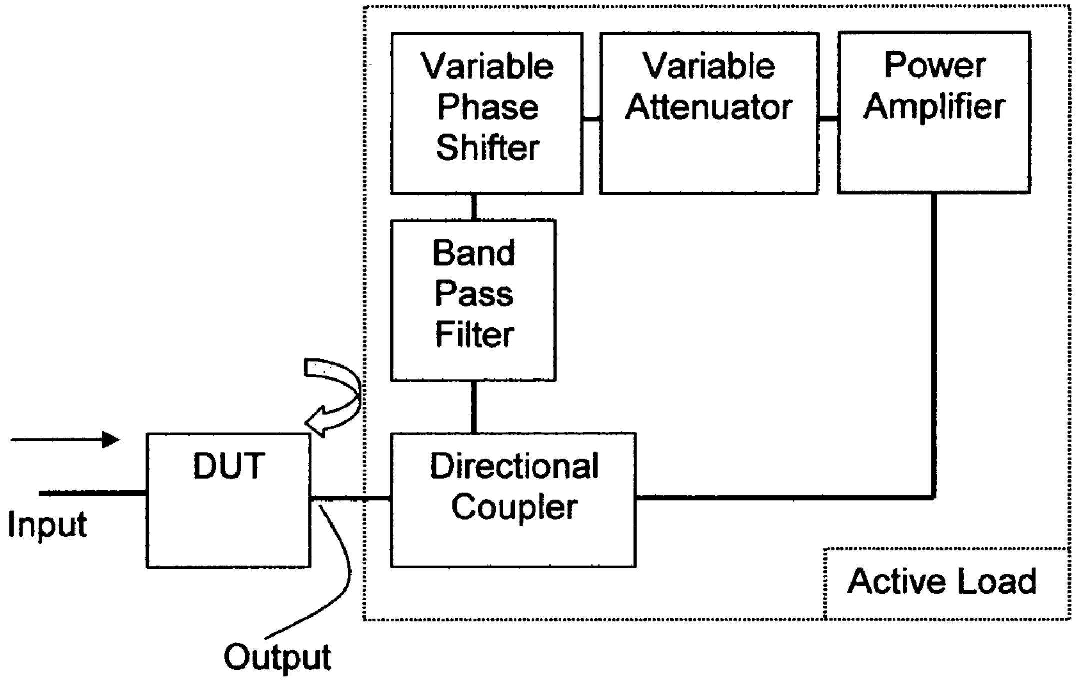
*Figure 2 – Prior Art -*

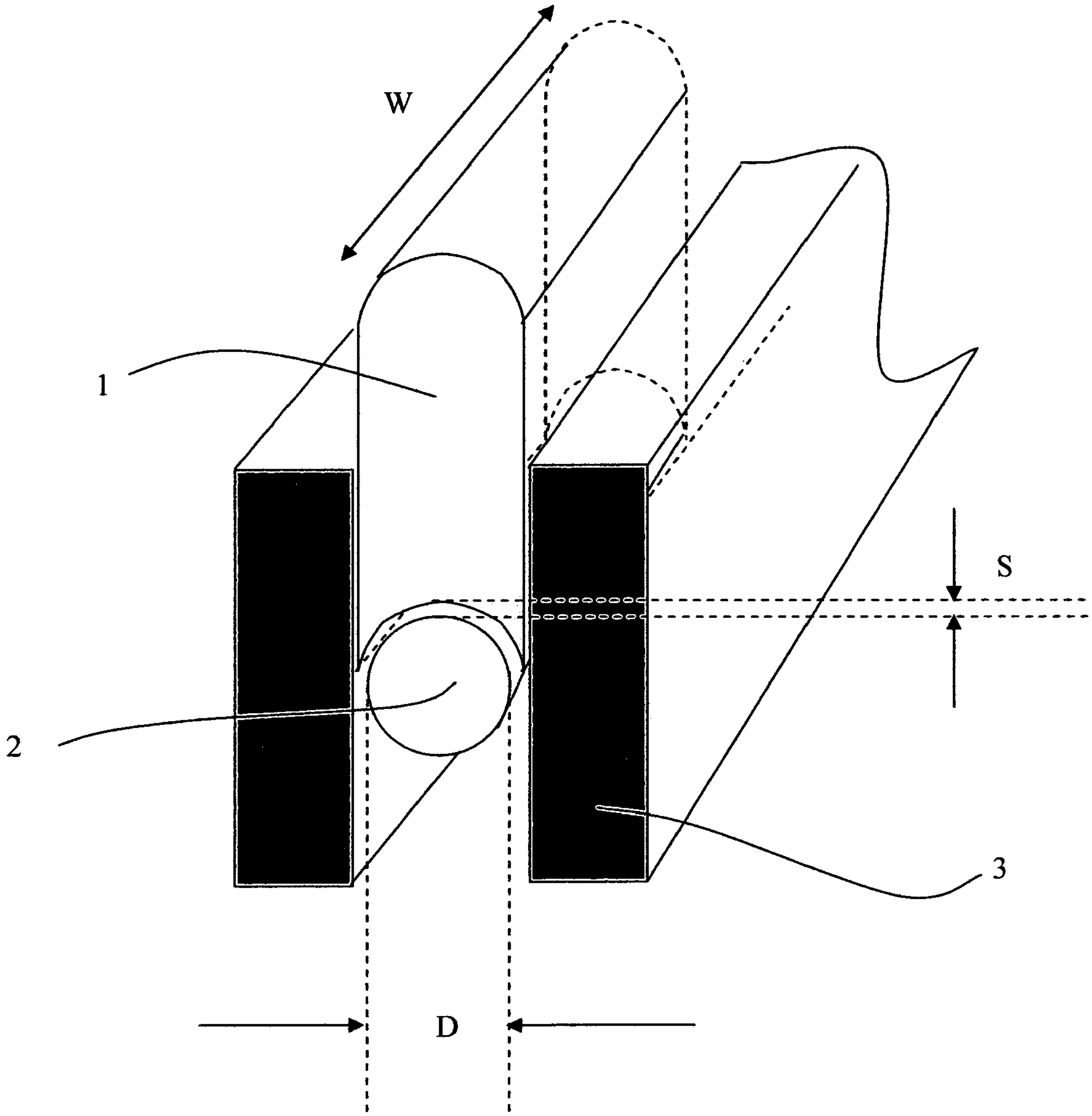
*Figure 3 – Prior Art -*

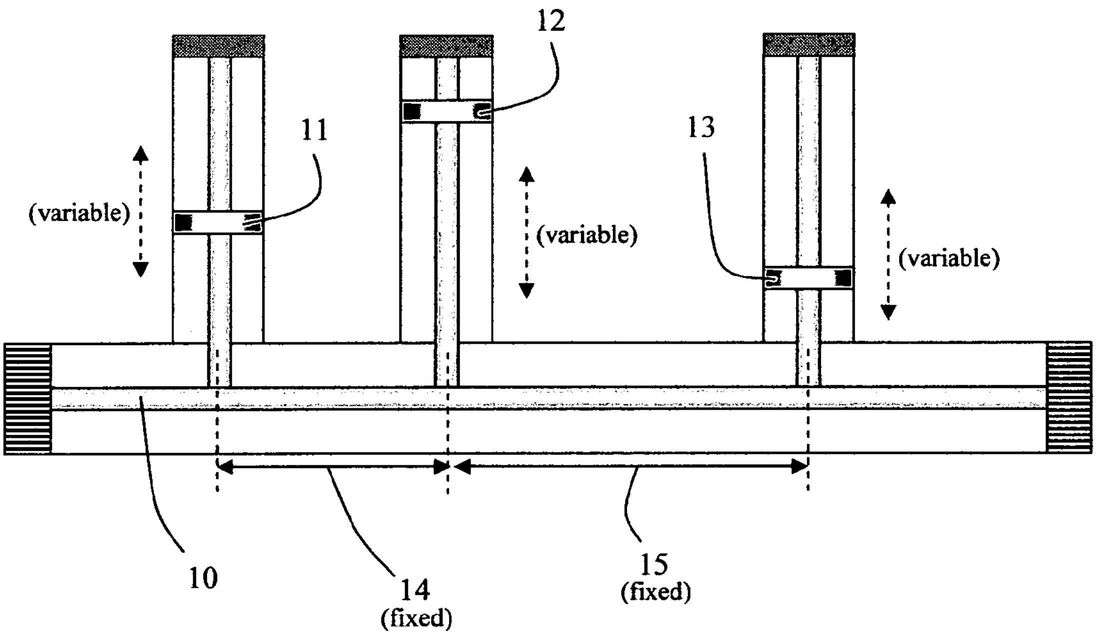
*Figure 4 – Prior Art -*

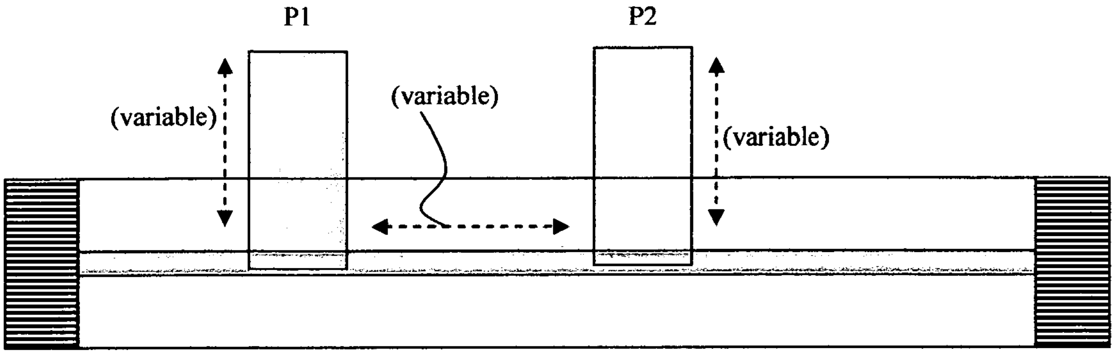
*Figure 5a – Prior Art -*
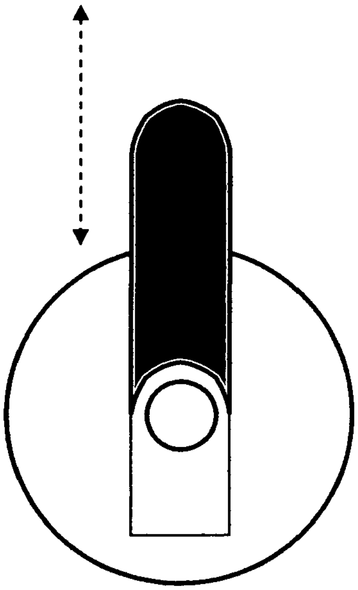
*Figure 5b – Prior Art -*

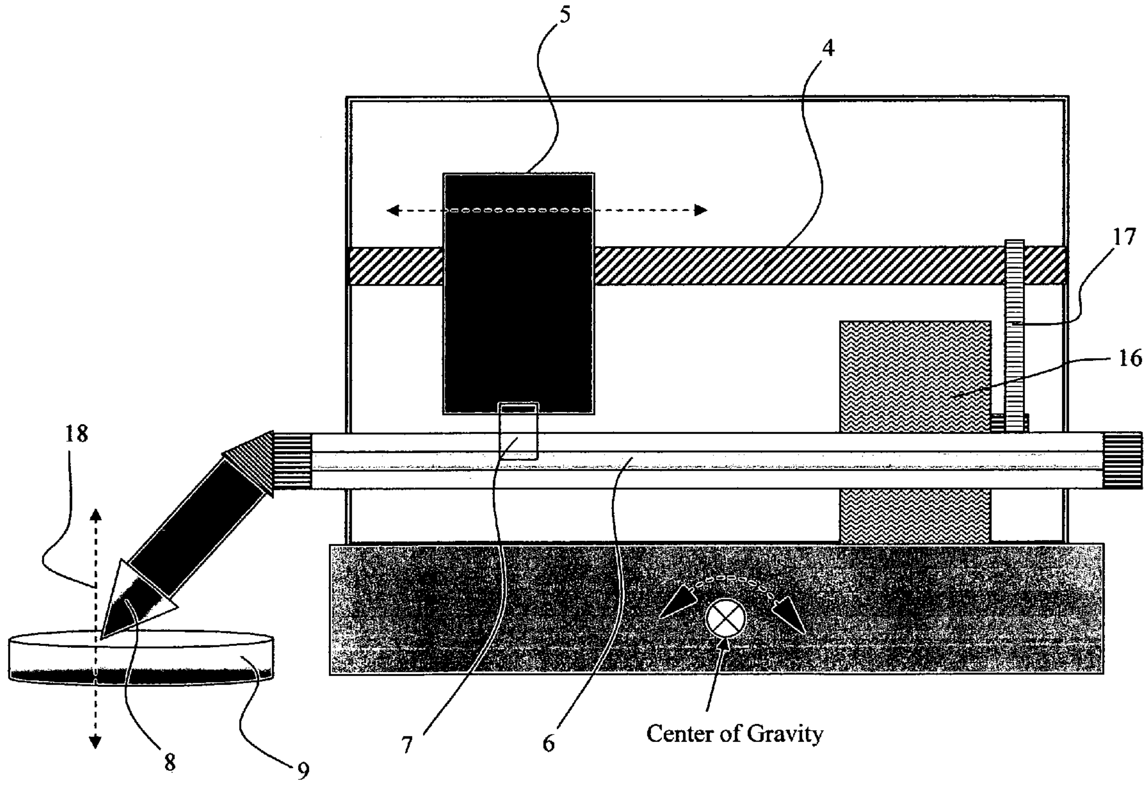
*Figure 6 – Prior Art -*

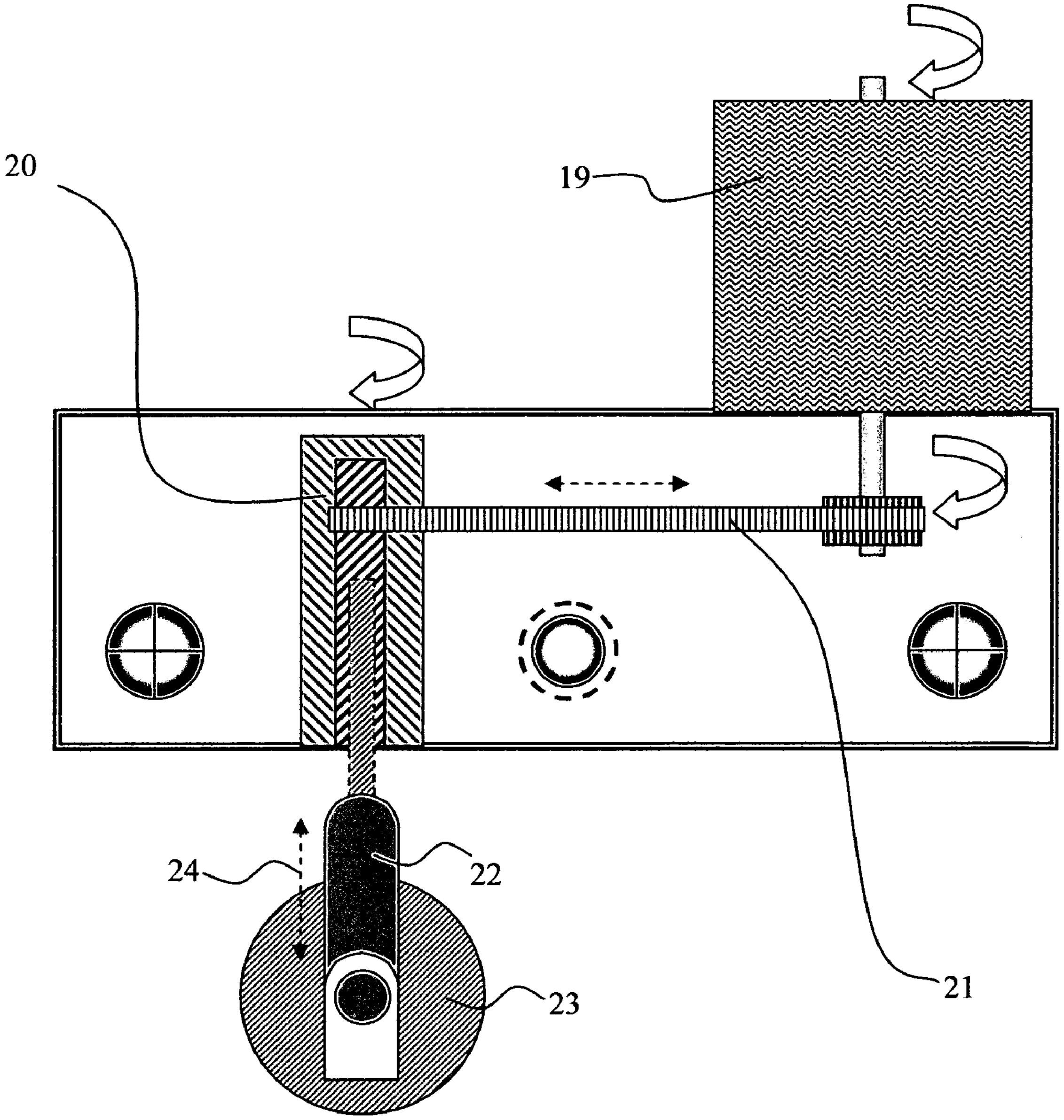
*Figure 7 – Prior Art -*

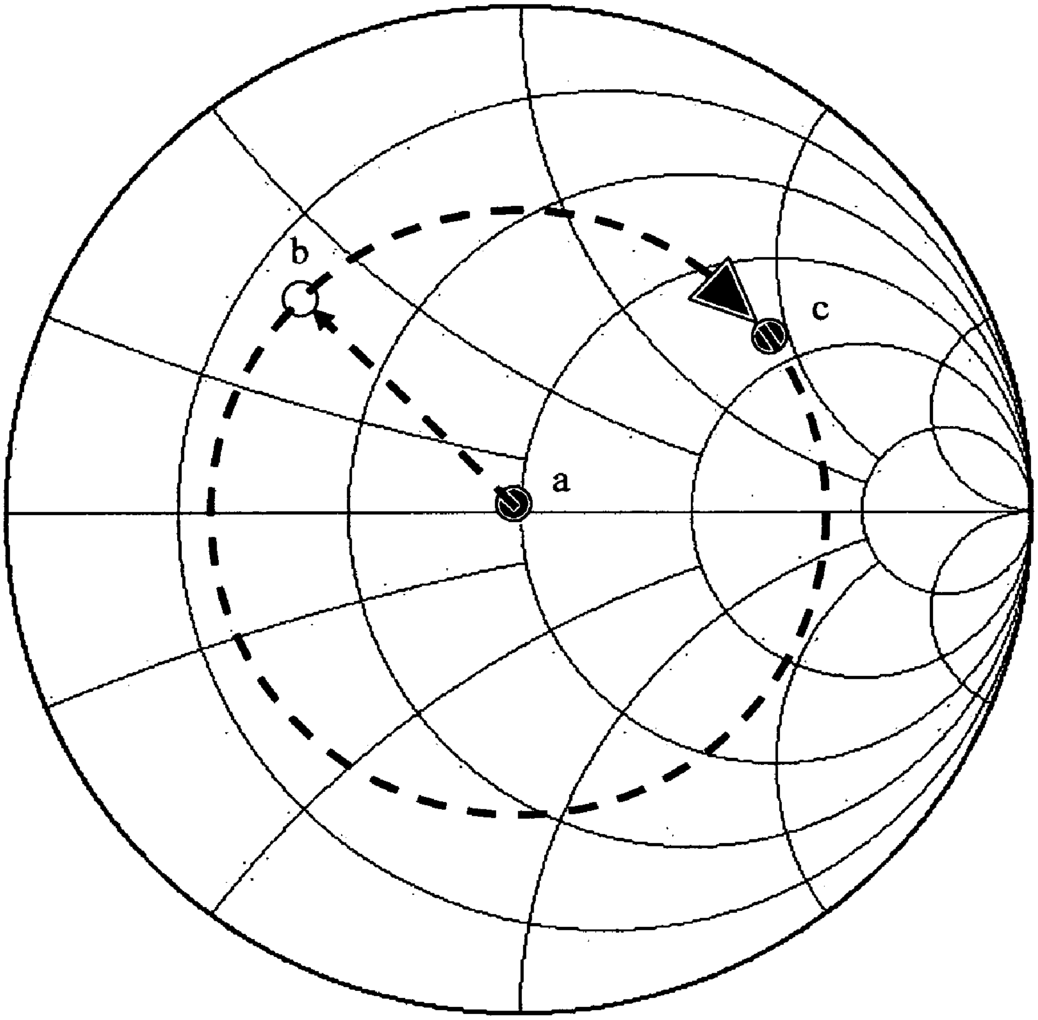
*Figure 8 – Prior Art -*

TRIPLE PROBE AUTOMATIC SLIDE SCREW LOAD PULL TUNER AND METHOD

PRIORITY CLAIM

Not Applicable

CROSS-REFERENCE TO RELATED ARTICLES

[1] "Product Note #41: Computer Controlled Microwave Tuner, CCMT", Focus Microwaves Inc., January 1998.

[2] ATN Microwave Inc., "A Load Pull System with Harmonic Tuning", Microwave Journal, March 1996, page 128–132.

[3] Tsironis, C. "System Performs Active Load-Pull Measurements", Microwaves & RF, November 1995, page 102–108.

[4] Maury Microwave Corp., "Precision Microwave Instruments and Components Product Catalogue, 2001, page 158.

[5] Tsironis, C. U.S. Pat. No. 6,674,293 "Adaptable Pre-matched tuner system and method".

STATEMENT REGARDING FEDERALLY SPONSORED RESEARCH OR DEVELOPEMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull and noise testing of microwave power and low noise transistors using automatic microwave tuners in order to synthesize reflection factors (or impedances) at the input and output of said transistors.

Modern design of high power microwave amplifiers, oscillators and other active components used in various communication systems, requires accurate knowledge of the active device's (microwave transistor's) characteristics. In such circuits, it is insufficient and inaccurate for the transistors operating in their highly non-linear or very low noise regions, to be described using analytical or numerical models only. Instead the devices must be characterized using specialized test setups under the actual operating conditions.

A popular method for testing and characterizing such microwave components (transistors) is "load pull" (for high power operation) and "source pull" (for low noise operation). Load pull or source pull are measurement techniques employing microwave tuners and other microwave test equipment. The microwave tuners are used in order to manipulate the microwave impedance conditions under which the Device Under Test (DUT, or transistor) is tested (FIG. 1).

There are essentially three types of tuners used in such test setups: a) Electro-mechanical slide screw tuners [1], (FIG. 1), b) Electronic tuners [2] and c) Active tuners [3], (FIG. 2).

Electro-mechanical tuners [1] have several advantages compared to electronic and active tuners, such as long-term stability, higher handling of microwave power, easier operation and lower cost. Electro-mechanical tuners use adjustable mechanical obstacles (probes or slugs)(1) inserted into the transmission media of the tuners (FIG. 3) in order to reflect part of the power coming out of the DUT and to create a "real" impedance presented to the DUT, instead of a "virtual" impedance created using active tuners in a setup as shown in FIG. 2.

Electro-mechanical tuners, as used in set-ups shown in FIG. 1, use the 'slide screw' principle, a tuning mechanism, as shown in FIG. 3; in this configuration the capacitive coupling between the vertical probe (1) and the central conductor (2) of the slofted airline (slabline)(3) creates a wideband reflection, Γ (or S11), of which the amplitude can be adjusted by modifying the distance "S" between the probe and the central conductor and therefore by changing the value of the capacitive between the central conductor and the probe.

In order to change the phase of the reflection factor S11 the RF probe (1), already inserted in the slabline (3), must be moved horizontally along the axis of the slabline and at constant distance from the center conductor (FIG. 3). This is accomplished using a lead-screw mechanism coupled with a stepper motor (FIG. 6); the lead screw (4) pushes a mobile carriage (5) along the slabline (6) axis; the carriage itself holds the RF probe (7) and can move it vertically in and out of the slabline.

The combination of both horizontal and vertical movement of the RF probe inside the slabline allows the creation of complex reflections factors S11 covering the entire Smith Chart (FIG. 8). Starting at point a, which corresponds to no reflection at all, we move the probe close to the central conductor thus creating a reflection and reach point b. Then we move the probe horizontally and turn on a circle of constant radius on the Smith Chart and reach point c.

There are two disadvantages to this approach: The first is that moving horizontally in order to change the phase of S11 takes a long time, especially at lower frequencies; the necessary horizontal travel, in order to cover 360° of phase, is lambda/2, where lambda is the electrical wavelength at a given frequency; at 1 GHz this is 15 cm, at 2 GHz 7.5 cm, etc. The second more important disadvantage, is that if the tuners are used in on-wafer setups, horizontal movement and tuner initialization create mechanical movements and vibrations of the tuners, which are transferred to the wafer probes (8) and may destroy the DUTs (=chips on-wafer) (9). FIG. 6 illustrates how the change of the center of gravity creates a "tilting" of the tuner and a movement of the wafer probes, which can be measured and is shown in FIG. 13.

Whereas horizontal RF probe movement is associated with movement of the massive mobile carriage (5), thus creating vibration problems, vertical movement (FIG. 7), even if it is also created using stepper motors, is associated with accelerating and decelerating much lower mechanical mass, and thus creates negligible or no mechanical vibrations (FIG. 15).

In order to determine the configuration necessary for this type of tuner to be able to tune over a considerable area of the Smith Chart using only vertical movement of the probes, a certain electrical distance between the probes L1 and L2 (FIG. 9) has to be chosen and maintained. The optimum configuration has been determined using an electrical equivalent circuit (model) (FIG. 11).

The model allows analyzing the microwave behavior of the circuit for the various horizontal and vertical positions of the probes and generates impedance plots on the Smith Chart (FIGS. 17–23).

It is the aim of this invention to propose a new tuner structure that employs, during normal measurement operation, only vertical movements, using three RF probes (slugs), inserted in the same type of slabline as tuners described in prior art.

DESCRIPTION OF PRIOR ART

Manual triple stub tuners [4] have been used for some time in RF-microwave technology. They consist of a coaxial transmission line (10) and three variable coaxial shorts (11, 12, 13) connected in parallel at certain distances (14, 15), chosen in order to cover certain frequency bands (FIG. 4).

The variable shorts act, at different frequencies, either as capacitance or as inductance, depending of the distance between the variable short and the central conductor of the airline. This allows creating variable and adjustable reflection factors over parts of the Smith Chart.

Triple stub tuners (FIG. 4) have not been known in automatic form. It is also important to recognize that "triple stub" is not the same as "triple probe". A "probe", as described in this invention does not make galvanic contact with the central conductor of the airline and is always capacitive, whereas a "stub" creates galvanic contact (thus not allowing to pass DC bias to the DUT through the tuner) and can have both a capacitive or inductive effect on the airline.

Also, manual triple stub tuners, as described and used so far, have fixed electrical distance between stubs, and provide limited Smith Chart coverage over a wider frequency range.

Slide screw tuners have, on the other hand, been reported both in manual and automatic form but only in "single probe" or "double probe" configuration, described also as "pre-matching" tuners (FIG. 5*a*). These tuners behave, in principle, like the here proposed "triple probe" tuner, but lag one tuning dimension, which is, in this invention, made up by the third probe. These pre-matching tuners need to move the probes also horizontally during normal operation, in order to generate reflection factors over the entire Smith Chart, and thus, these same horizontal movements create the mechanical vibrations, which this invention aims to eliminate [5].

The triple probe tuner concept described here uses the same type of electro-mechanical remote probe control as existing automatic slide screw tuners [1]. FIG. 6 shows the concept of the horizontal probe control, where a stepper motor (16) uses a timing belt (17) to rotate the lead screw (4), which then moves the mobile carriage (5) along the slabline axis (6). As the carriage moves horizontally, the center of gravity of the tuner changes and this creates a changing momentum and a rotation. This translates into a vertical movement (18) of the probe (8), which can be measured and is shown in FIG. 13. Short-term vibrations of the probe due to horizontal carriage movement are also measurable (FIG. 14).

A vertical remotely controlled movement mechanism of automatic slide screw tuners is shown in FIG. 7. A stepper motor (19) turns the vertical screw (20), by means of a timing belt (21), in and out of the slotted airline (23). In this case there is no shift of the center of gravity (FIG. 6) and no long-term vibration (FIG. 15) and, because of much lower mass involved in this movement the associated short-term vibration level is also negligible (FIG. 16).

BRIEF SUMMARY OF THE INVENTION

This invention concerns a new type of electro-mechanical tuner, the "triple probe slide screw tuner" (FIGS. 9, 10). This new tuner type has the capability of synthesizing a large number of RF impedances, practically covering the entire Smith Chart, by using only vertical movement of its three RF probes.

For each frequency, the electrical distances (L1, L2) between probes define the actual reflection factor coverage on the Smith Chart. An electrical model allows determining these optimum distances (FIG. 11). This model allows to simulate the effect of varying the electrical distance between probes (P1, P2, P3) and calculate the Smith Chart coverage on the reflection factor when the probes are moved close or further away from the center conductor of the slabline (FIG. 9).

The effect of moving the probes closer to the center conductor is simulated by variable capacitors (FIG. 11). We have chosen typical capacitance values (C1, C2, C3) for this model. The minimum value is 0 pF and the maximum value is 10 pF.

BRIEF DESCRIPTION OF THE SEVERAL VIEWS OF THE DRAWINGS

The file of this patent contains at least one drawing executed in color. Copies of this patent with color drawings(s) will be provided by the Patent and Trademark Office upon request and payment of the necessary fee.

The invention and its mode of operation will be more clearly understood from the following detailed description when read with the appended drawings in which:

FIG. 1 depicts prior art, a load pull test set-up using passive electromechanical tuners.

FIG. 2 depicts prior art, a load pull test set-up using active tuners (only output section is shown, the input section is symmetrical).

FIG. 3 depicts prior art, a cross section of an RF probe being inserted in a slotted airline (slabline).

FIG. 4 depicts prior art, a triple stub manual microwave tuner.

FIG. 5*a, b* depicts prior art, a dual probe slide screw tuner, also named "pre-matching" tuner and schematics of a cross section of the tuning mechanism [5].

FIG. 6 depicts prior art, a front view of the horizontal probe movement mechanism of a slide screw load pull tuner.

FIG. 7 depicts prior art, a cross section of the vertical probe movement mechanism of a slide screw tuner.

FIG. 8 depicts prior art, the tuning trajectory from point a to any point c generated by a slide screw tuner represented on a Smith Chart.

DETAILED DESCRIPTION OF THE INVENTION

This invention describes a new type of electro-mechanical tuner, the "triple probe slide screw tuner", designed in order to avoid horizontal mechanical movement of its mobile probe carriage during load pull or noise measurement operations. To accomplish this the probes and their mutual positioning must be selected such as to generate reflection factors covering a maximum area of the Smith Chart using vertical movement only.

However, in order to also cover a maximum frequency bandwidth the mutual distance between probes must also be adjustable at each selected frequency. As can be seen from FIGS. 17–23, the actual distance between probes does influence the impedance coverage, but not very sensitively. So it is also possible to cover a certain frequency band without having to move the probes horizontally.

But, even if a horizontal movement of the probes is necessary, it is not disturbing a normal load pull or noise operation, since such operations are not done at swept frequencies, instead they are done at fixed frequencies for most of the time, and only the reflection factors are swept over the entire Smith Chart.

For each specific frequency, the electrical distance between probes defines the actual reflection factor coverage on the Smith Chart. The electrical model of FIG. 11 allows determining this optimum distance for the purpose of understanding. In practice however the optimization of the distance is going to be made experimentally, during tuner calibration and operation.

Figure 9:
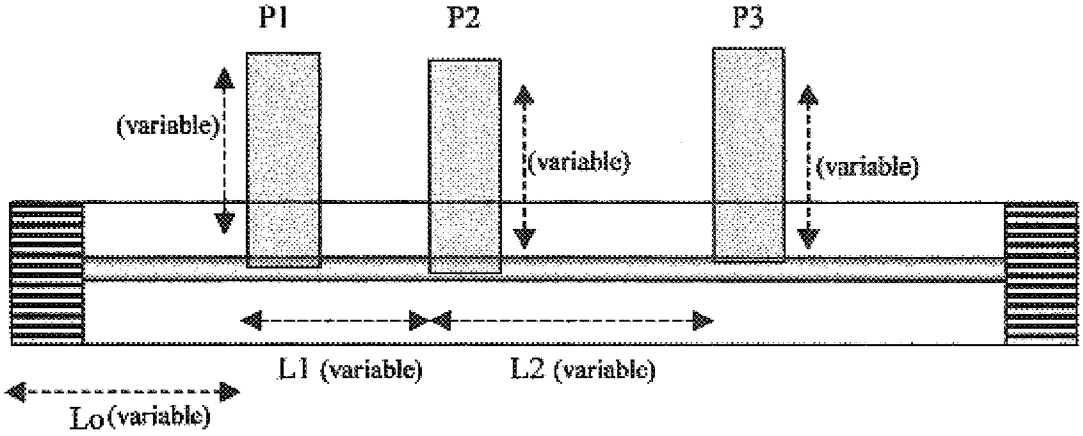
FIG. 9 depicts the structural layout of the tuning section of a triple probe slide screw tuner. The cross-section of the tuning mechanism is as shown in FIG. 5*b*.
Figure 10:
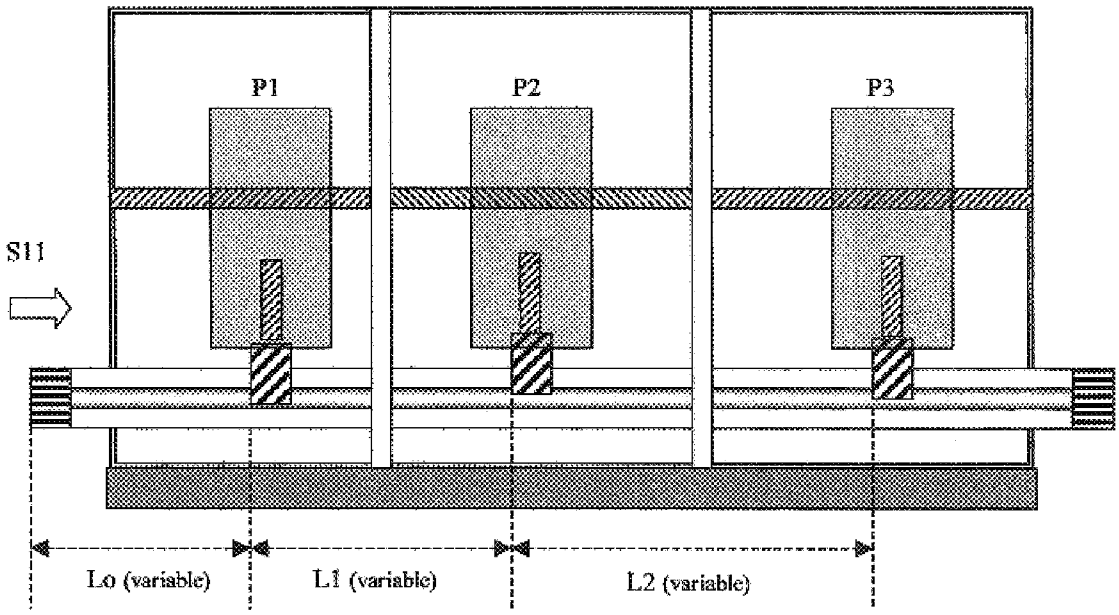
FIG. 10 depicts a frontal view of the layout and structure of the complete triple probe tuner.
Figure 11:
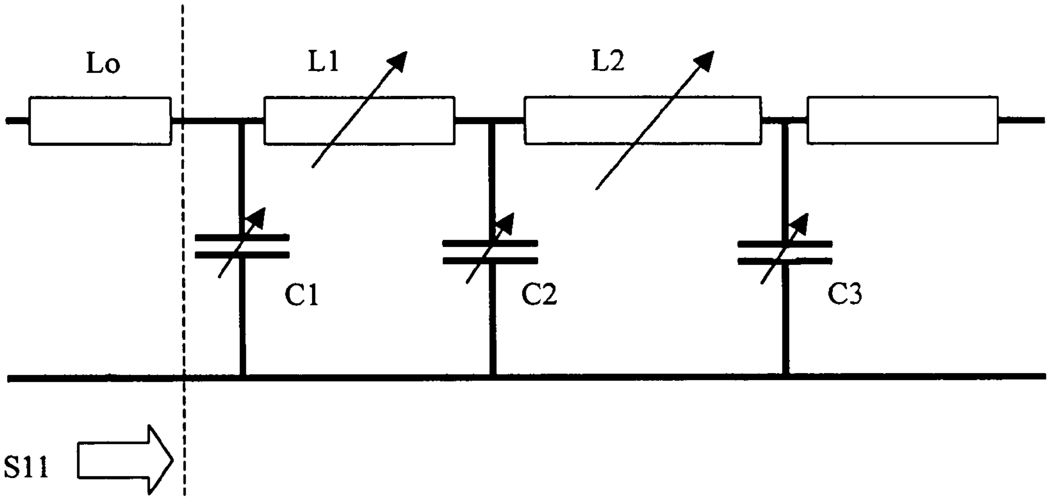
FIG. 11 depicts an electrical model allowing to analyze the tuning capability of a triple probe tuner.
Figure 12:
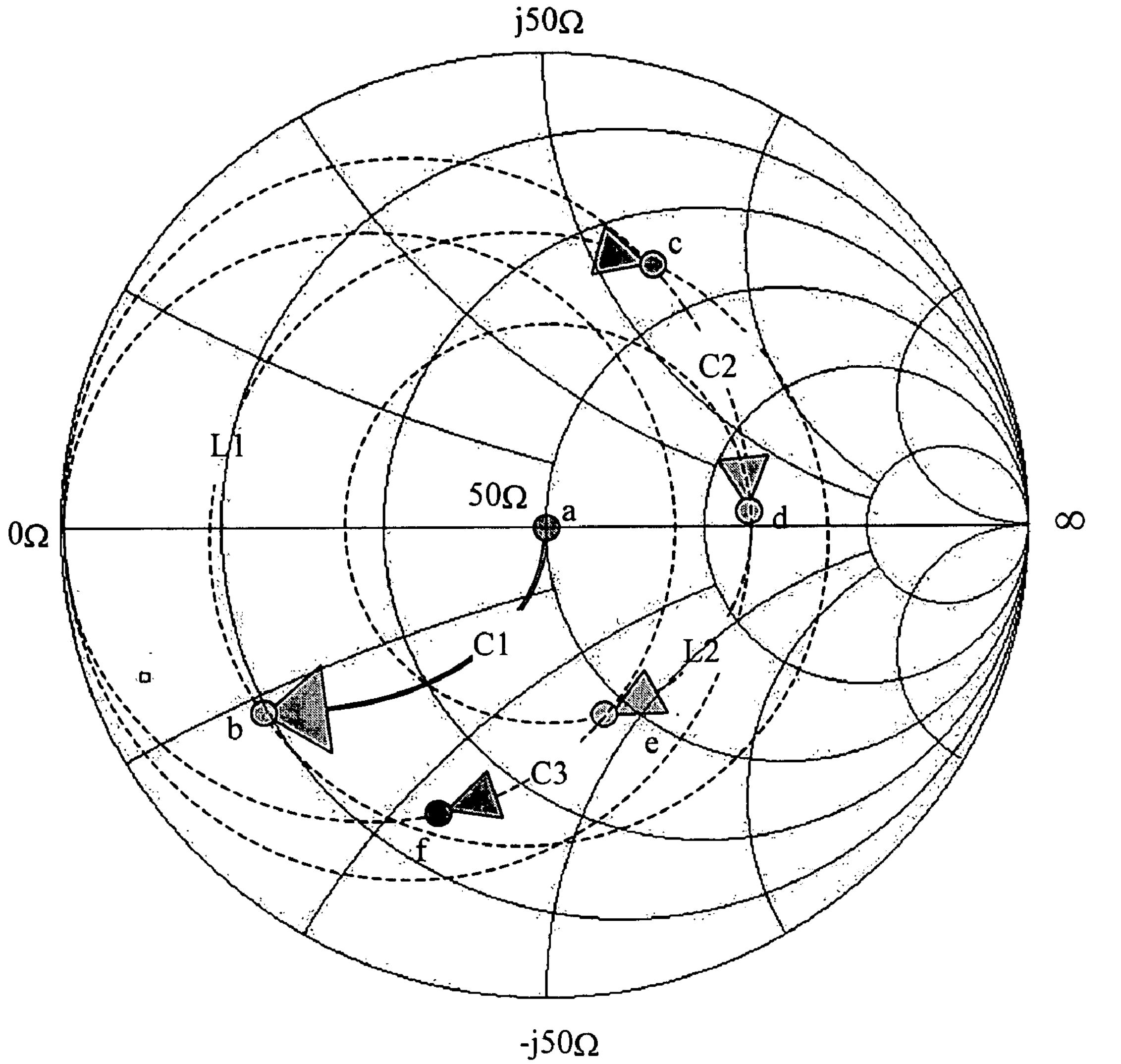
FIG. 12 depicts the tuning trajectory of a triple probe tuner on the Smith Chart, between points a and f; values are shown at the reference plane of the first capacitor C1 (or probe P1).

The model of FIG. 11 allows simulating the effect of varying the electrical distances (L1, L2) between probes and the Smith Chart coverage of the reflection factor, when the probes are moved close to or further away from the center conductor of the slabline. The effect of moving the probe close to the center conductor is simulated by variable capacitors (C1, C2, C3) (FIG. 11). We have chosen typical capacitance values for this model. The minimum value is 0 pF and the maximum value is 10 pF.

The capacitance between two adjacent metallic surfaces can be calculated using the well know formula $C=\epsilon_0*A/S$, where $\epsilon_0=0.886*10^{-11}$ F/m (FIG. 3), where A is the area between probe and center conductor and S is the air gap between probe and center conductor. We estimate the gap S to reach a mechanically well controllable minimum value of S=0.05 mm or slightly less; the diameter of the center conductor is 3 mm, for tuners capable of operating up to 18 GHz and the length of the probe is typically 10 mm, for operation around 2 GHz, the frequency we selected for carrying through the model calculations; we then obtain as a maximum value of the capacitance approximately 8 to 10 pF, a value we have used in our model of FIG. 11 and the simulation results shown in FIGS. 17–23.

The minimum vertical distance between the semi-cylindrical probe (1) and central conductor (2) of the airline (3), at which the probe can be moved reliably in horizontal direction can be smaller than 0.05 mm. We therefore assume, for the sake of the modelization, a safe minimum distance of 0.05 mm. The minimum value of the capacitance is, obviously, zero, or close to zero, if the probe is moved far away enough from the center conductor (FIG. 3).

As shown in FIGS. 17–23, changing the value of all capacitors of the equivalent model of FIG. 11, allows generating complex reflection factors covering a major area of the Smith Chart. The overall coverage depends also on the electrical distance between the capacitors (or probes).

The electrical distance or transmission phase is expressed in degrees, where 180° corresponds to one half of a wavelength, calculated from the well known formula:

Wavelength λ[mm]=300/Frequency [GHz]; or at 2 GHz the wavelength is 150 mm, and 1800 corresponds to 75 mm.

The model calculations can be carried through using several commercially available circuit simulation and analysis software packages. They are based on a nodal analysis of the circuits and provide results of scattering parameters (or 'S'-parameters), or other equivalent electrical parameters, as a function of frequency or, as in our case, for a given frequency as a function of the values of the circuit elements.

In this specific case, the electrical model of FIG. 11 is a 'parametric' analysis, in which the value of the frequency is kept constant; instead the values of the three capacitors C1 to C3 are varied between values of 0 pF and 10 pF in all possible combinations, and in steps of 0.1 pF. For each combination, the resulting reflection factor S11 is plotted as a dot on the Smith Chart for every permutation of the values of C1 to C3.

In each case shown in FIGS. 17–23, the horizontal distance between probes is constant and only the value of the capacitances (corresponding to the air gaps between the probes and the central conductor of the airline) in every possible permutation changes.

Observing FIGS. 17–23, we can conclude, that for each frequency, there is some optimum electrical length for which the Smith Chart coverage is optimum. It is also important to recognize, that the main area of coverage is determined by the electrical position and capacitance value of the first capacitance (or probe), especially if the value of this capacitance is high (or the equivalent of the probe being placed close to the center conductor of the airline).

Figure 25:
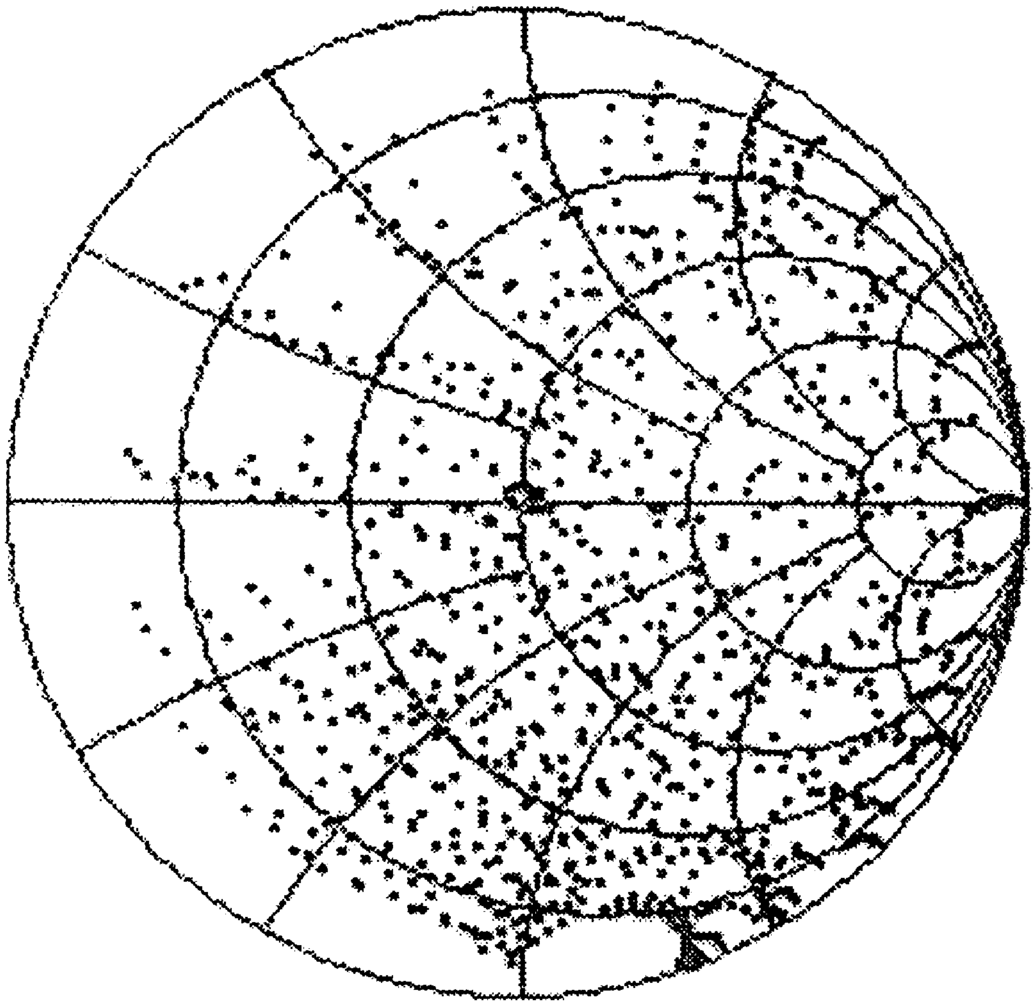
FIG. 25 depicts tuning coverage of a real triple probe tuner, measured at 4,000 GHz. Similarity with model data is obvious.

FIG. 25 shows measured tuning data of a real triple probe tuner. For practical reasons the number of vertical positions of each probe has been limited to 10, so the plot of FIG. 25 includes a total of 10×10×10=1000 measured points. Each point corresponds to a combination of probe settings. The plots of FIGS. 17–23 include instead 100×100×100=1,000,000 calculated points each. Comparing FIGS. 17–23 with FIG. 25 proves that our model of FIG. 11 is valid within the limitations of the lossless components (airline sections and capacitors) used in the model, as already mentioned, and so are the conclusions drawn from the model.

Figure 13:
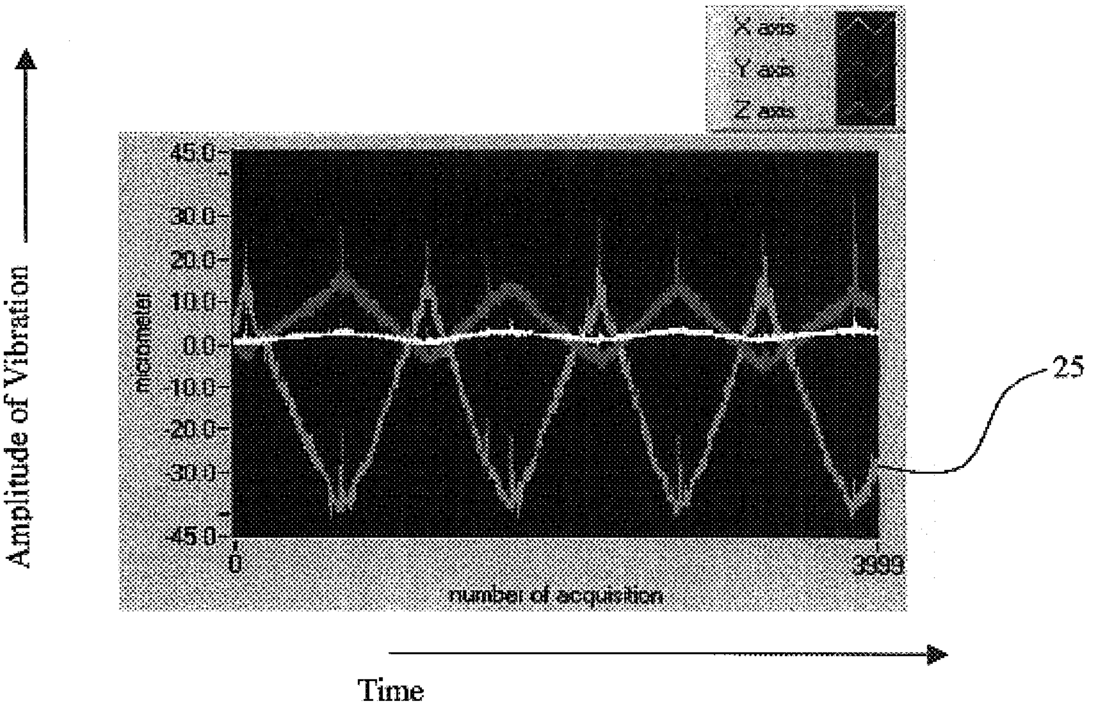
FIG. 13 depicts tuner tilting and long-term probe movement and vibration, due to horizontal movement of the carriage and the probes, measured at the tip of the tuner airline at its test port.
Figure 14:
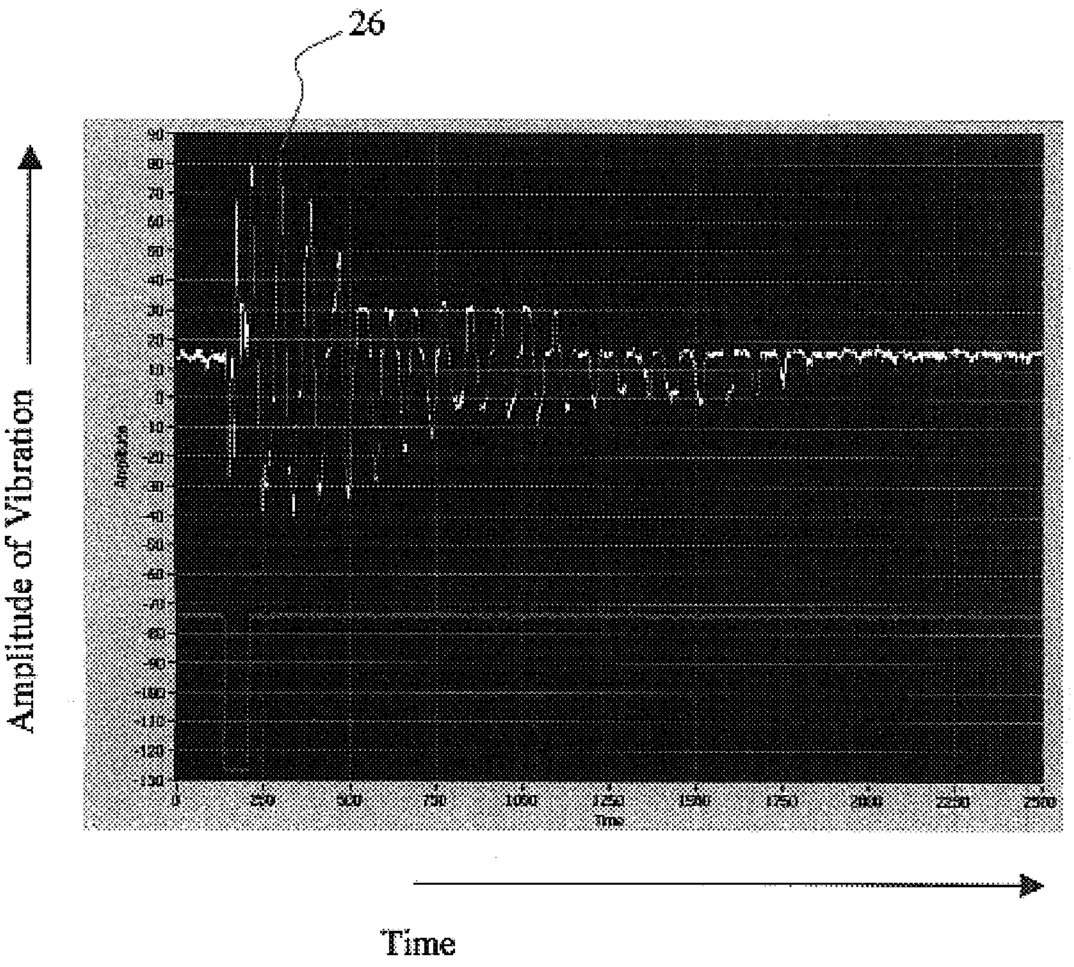
FIG. 14 depicts prior art: the short-term probe vibration of a traditional slide screw tuner operated on a wafer probe station, due to horizontal movement of the carriage and the probes.

FIGS. 13 and 14 show measured vibration data of a normal electromechanical load pull tuner when moving horizontally; FIG. 13 shows the long-term mechanical movement, due to displacement of the tuner carriage and the center of gravity of the tuner (25), and FIG. 14 shows the short-term vibration due to the horizontal motor activity (26).

Figure 15:
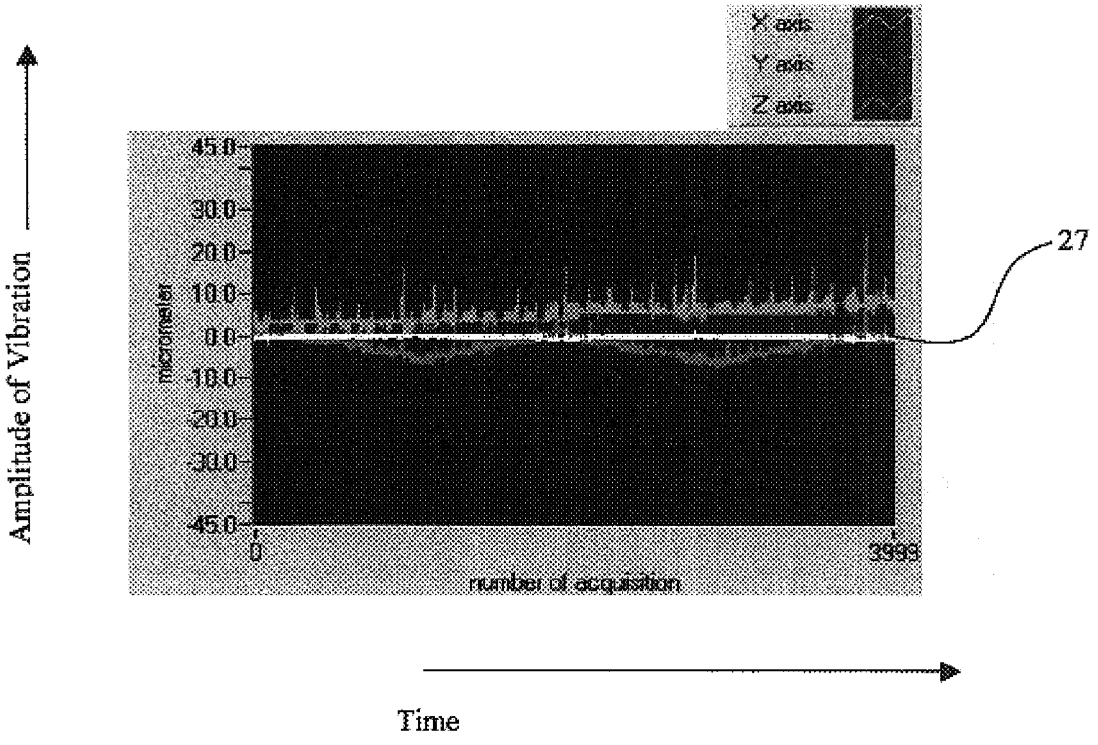
FIG. 15 depicts: the long term probe movement and vibration of a triple probe slide screw tuner operated on a wafer probe station, due to vertical-only movement of the probes.
Figure 16:
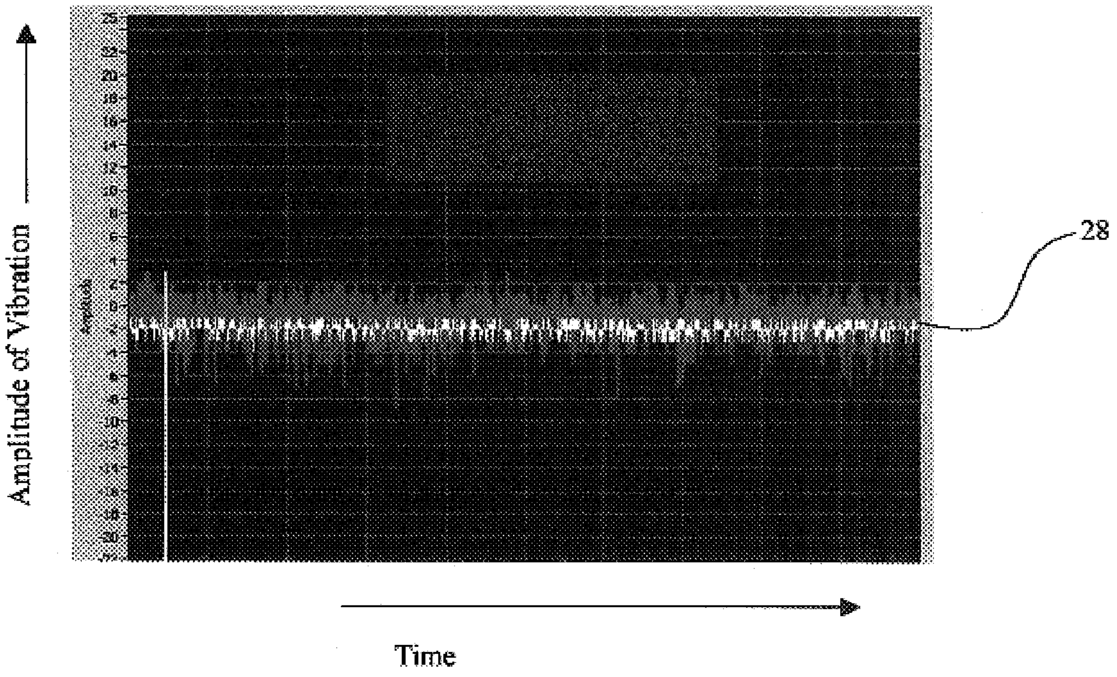
FIG. 16 depicts: the short-term probe vibration of a triple probe slide screw tuner operated on a wafer probe station, due to vertical-only movement of the probes.
Figure 17:
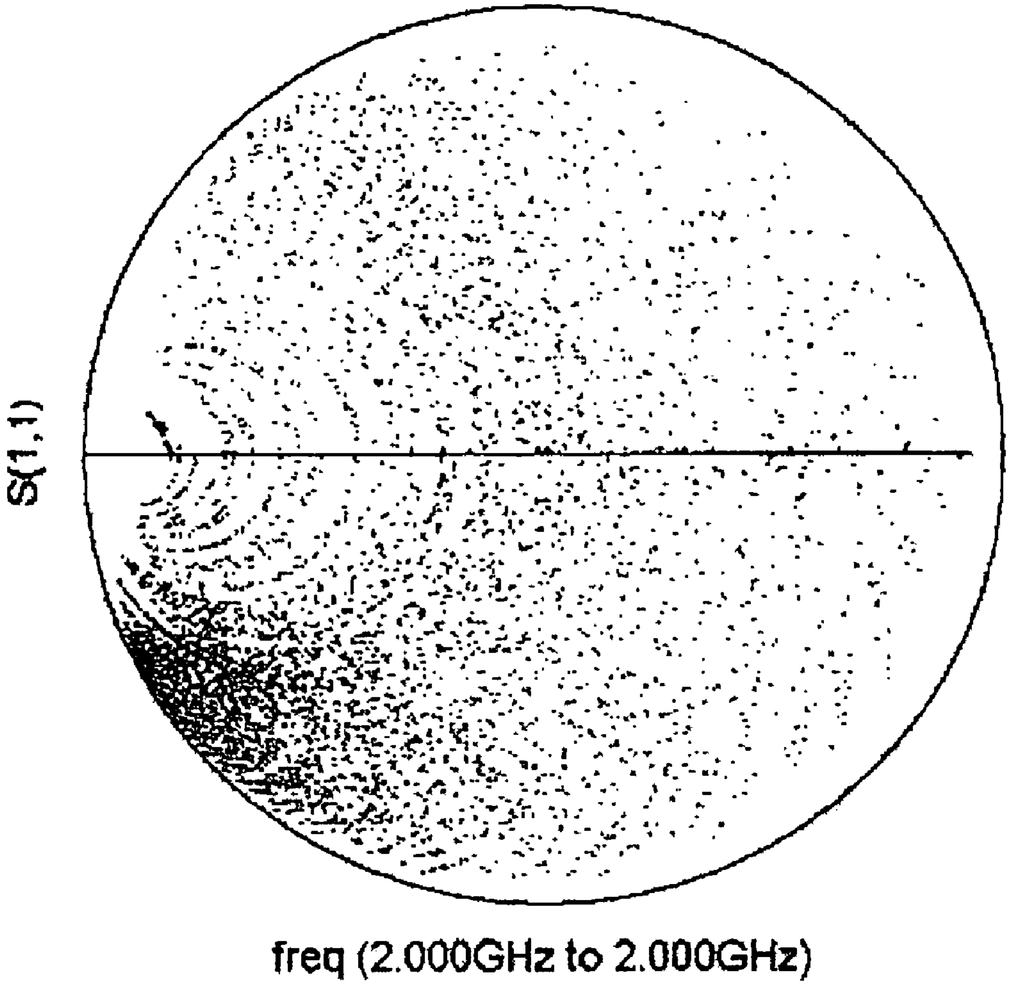
FIG. 17 depicts tuning coverage of the triple probe tuner for an electrical distance between probes 1 and 2 of 45° and between probes 2 and 3 of 45°.
Figure 18:
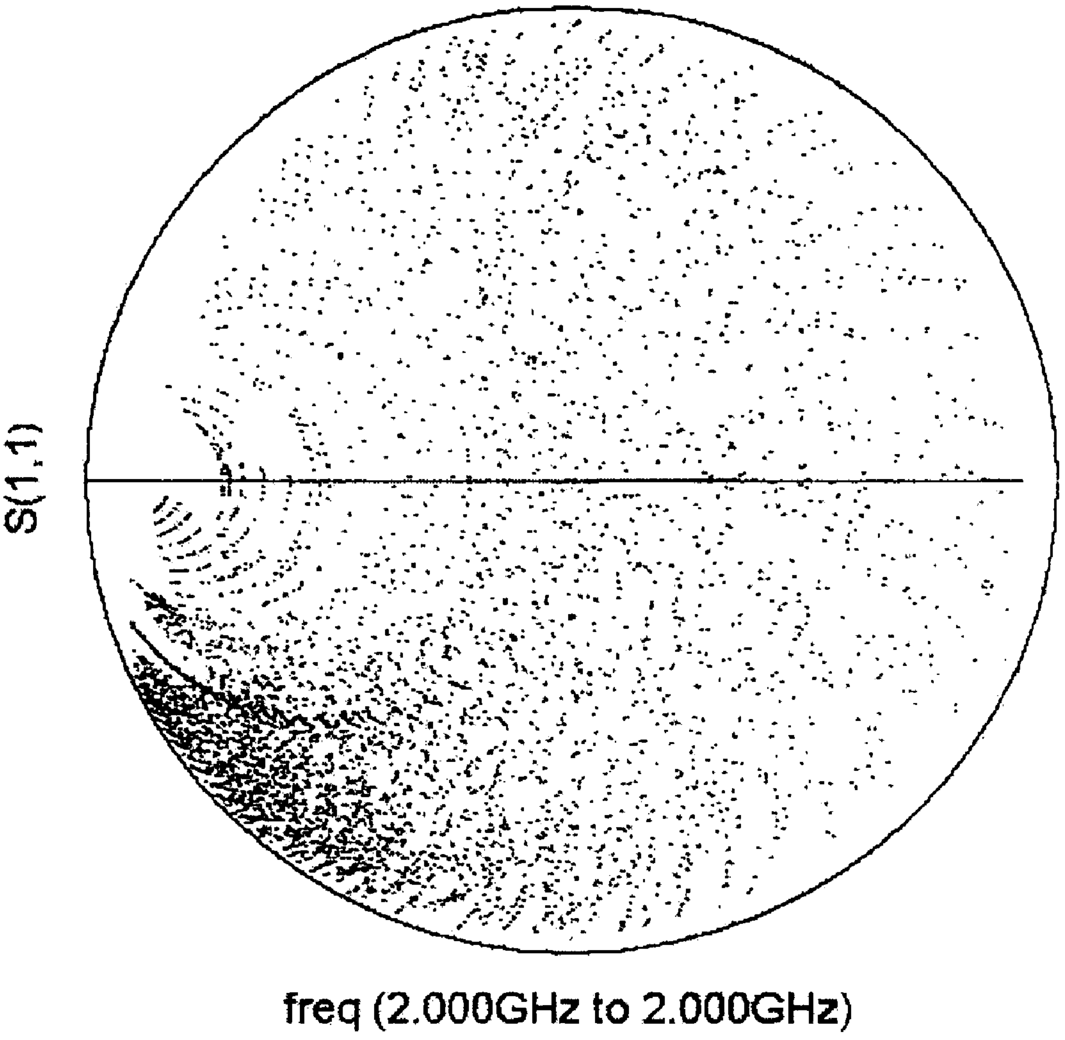
FIG. 18 depicts tuning coverage of the triple probe tuner for an electrical distance between probes 1 and 2 of 60° and between probes 2 and 3 of 90°.
Figure 19:
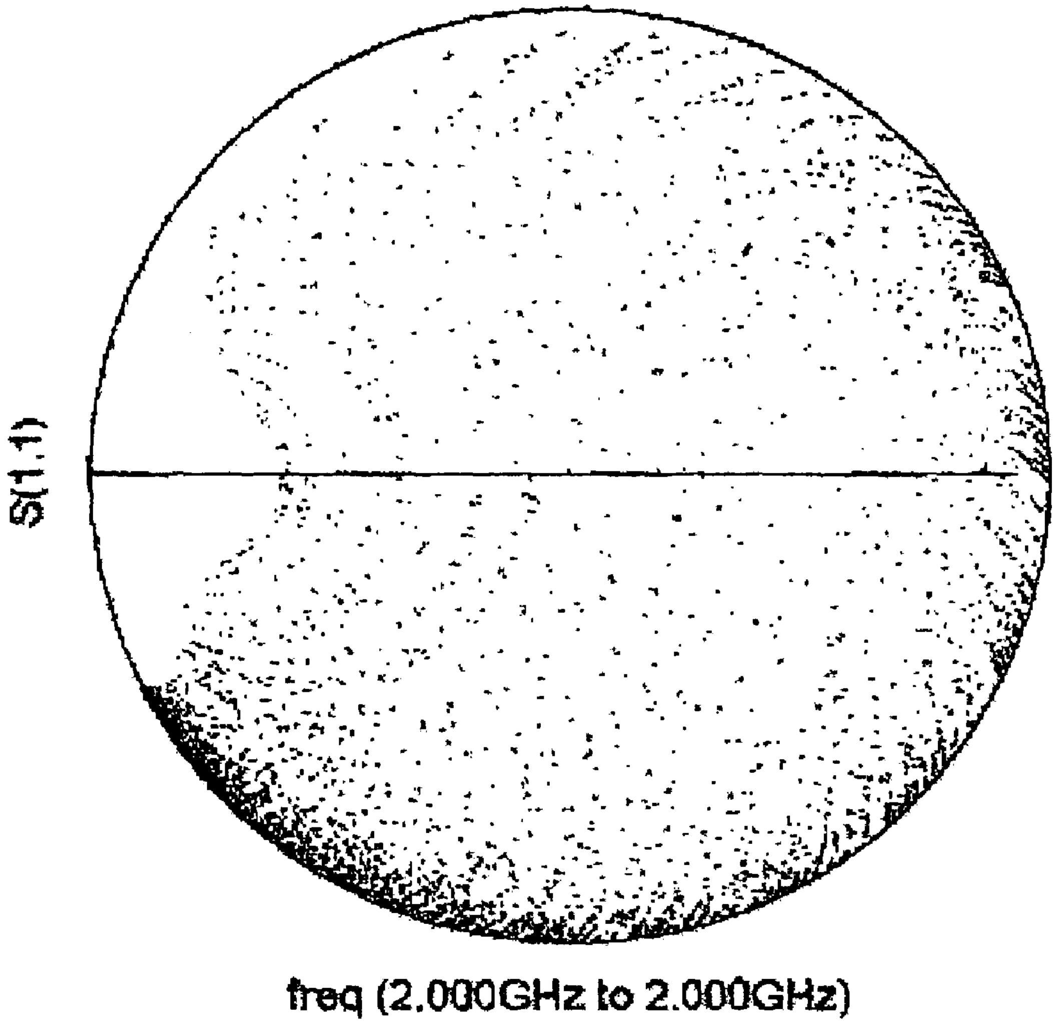
FIG. 19 depicts tuning coverage of the triple probe tuner for an electrical distance between probes 1 and 2 of 90° and between probes 2 and 3 of 1200.
Figure 20:
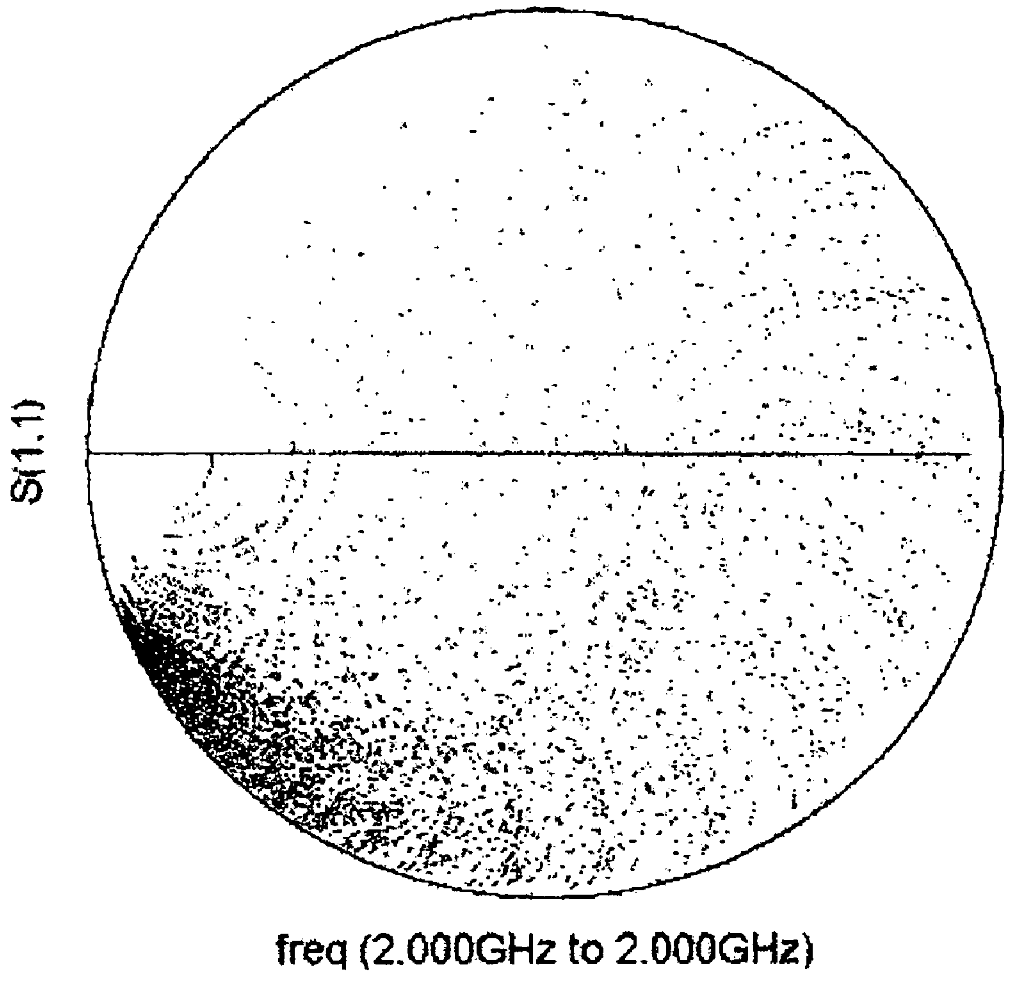
FIG. 20 depicts tuning coverage of the triple probe tuner for an electrical distance between probes 1 and 2 of 90° and between probes 2 and 3 of 45°.

FIGS. 15–16 show the same type of mechanical movement and vibration due to the vertical motor activity only (27,28). It is clear that the vertical axis does not create noticeable vibrations and thus a tuner using, during normal load pull operations, only vertical motor activity, does not suffer from undesired vibrations. By consequence, an electromechanical tuner, which moves its probes only vertically, for a full load pull operation, as described in this invention, does not create undesired mechanical movement and vibrations.

As mentioned before the tuning range of a triple-probe tuner at a given frequency depends on the actual position of its probes. FIGS. 17 to 23 illustrate this phenomenon on corresponding Smith Chart plots. In all plots the dots shown correspond to impedances created by the tuner model of FIG. 11, for all possible permutations of the values of the three capacitors C1 to C3 varying from 0 pF to 10 pF in steps of 0.1 pF. The electrical distance between probes C1 and C2 as well between probes C2 and C3 are fixed parameters of the simulation.

Most plots 17–23 show that a large area of the Smith Chart can be covered, but also that certain combinations of electrical lengths between probes provide better results than others. The fact that the achievable maximum reflection factors, shown in FIGS. 17–23, are close to 1 is a result of the simplified model: the model used does not include ohmic losses for the transmission lines Lo to L3. If we would include such losses the maximum reflection factors would be smaller than one, which would correspond closer to a real tuner.

However, this does not change the principal tuning effect illustrated by the plots of FIGS. 17–23, since the phase and amplitude of the capacitors are very close to real values. In general any loss in a load pull tuner, inserted before the tuning probe, will reduce the achievable reflection factor, but this is not in contradiction with the principle described here.

Figure 21:
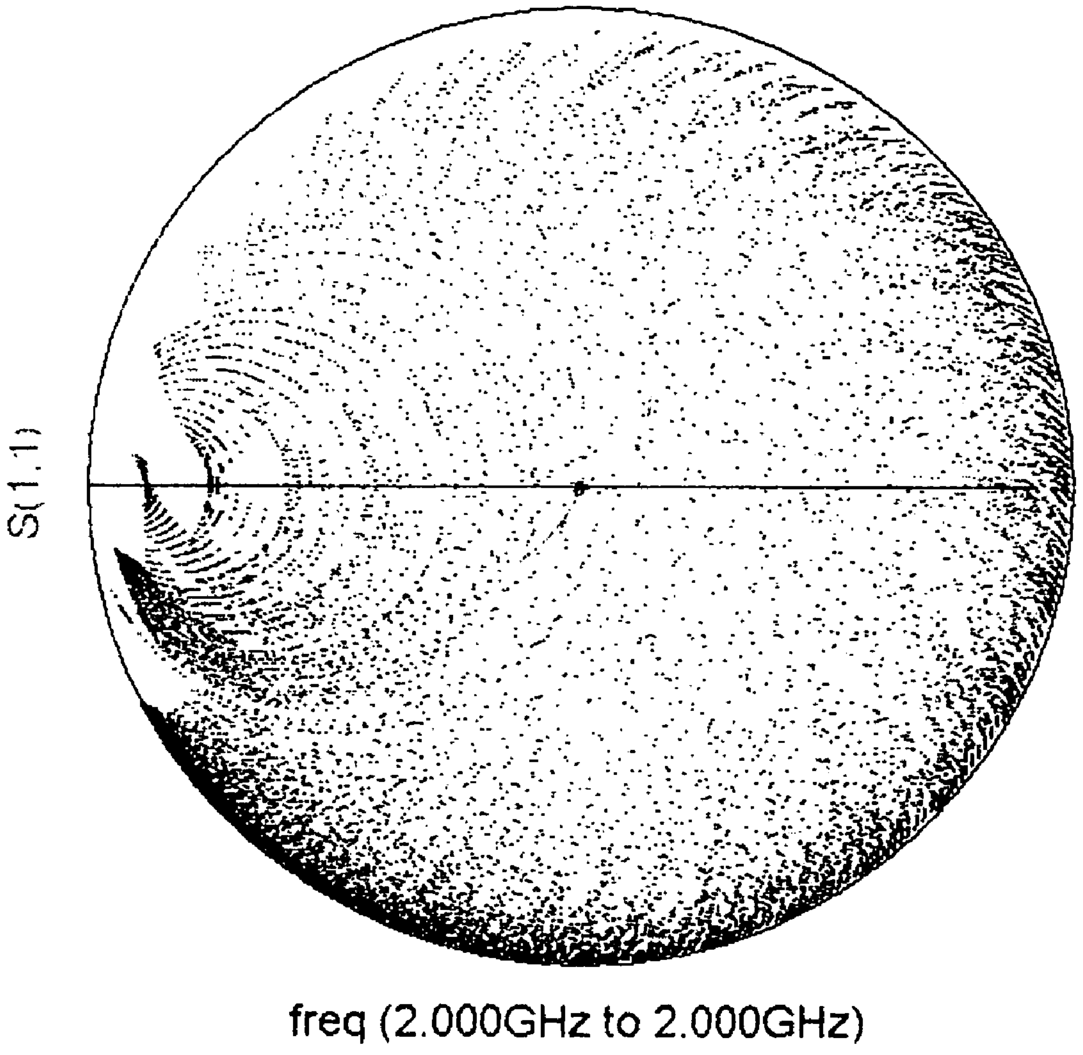
FIG. 21 depicts tuning coverage of the triple probe tuner for an electrical distance between probes 1 and 2 of 90° and between probes 2 and 3 of 90°.
Figure 22:
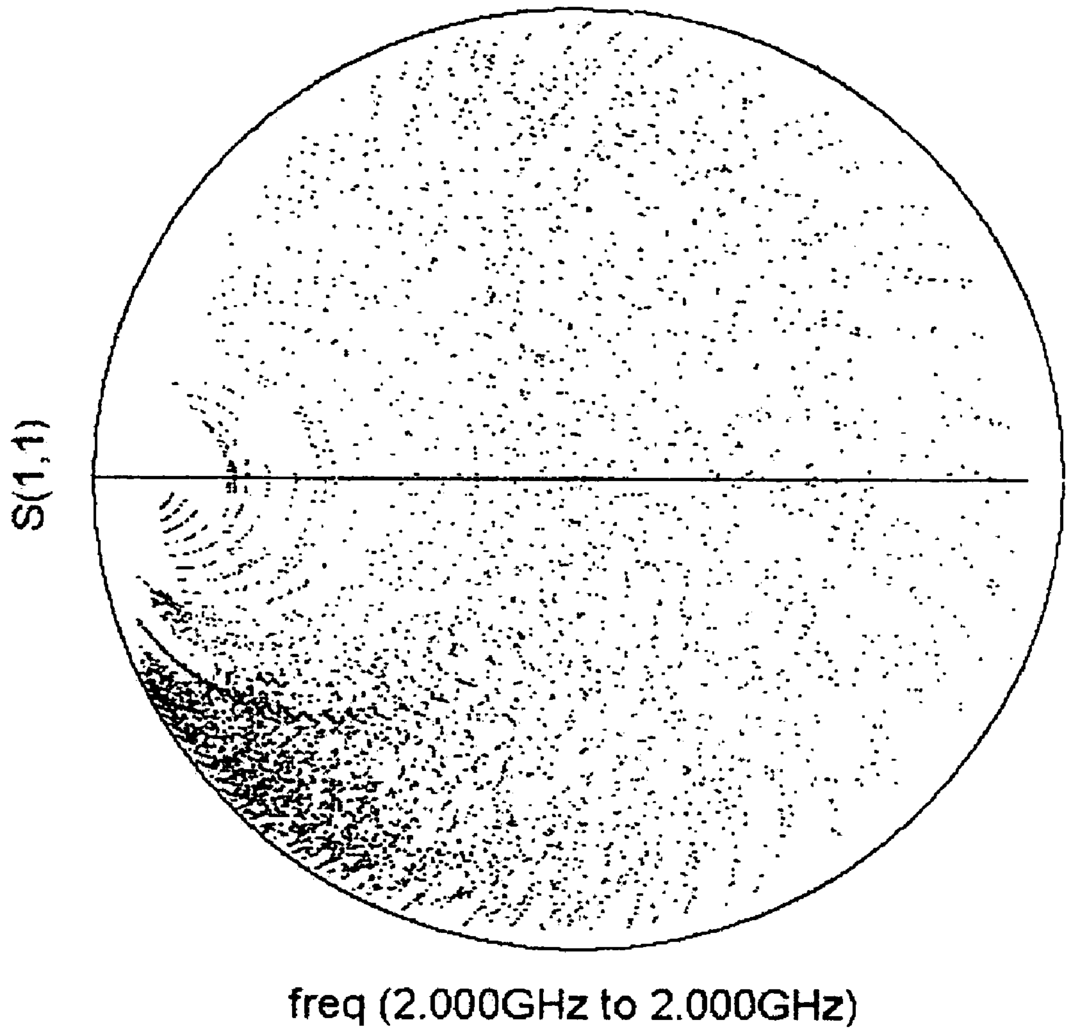
FIG. 22 depicts tuning coverage of the triple probe tuner for an electrical distance between probes 1 and 2 of 60° and between probes 2 and 3 of 60°.
Figure 23:
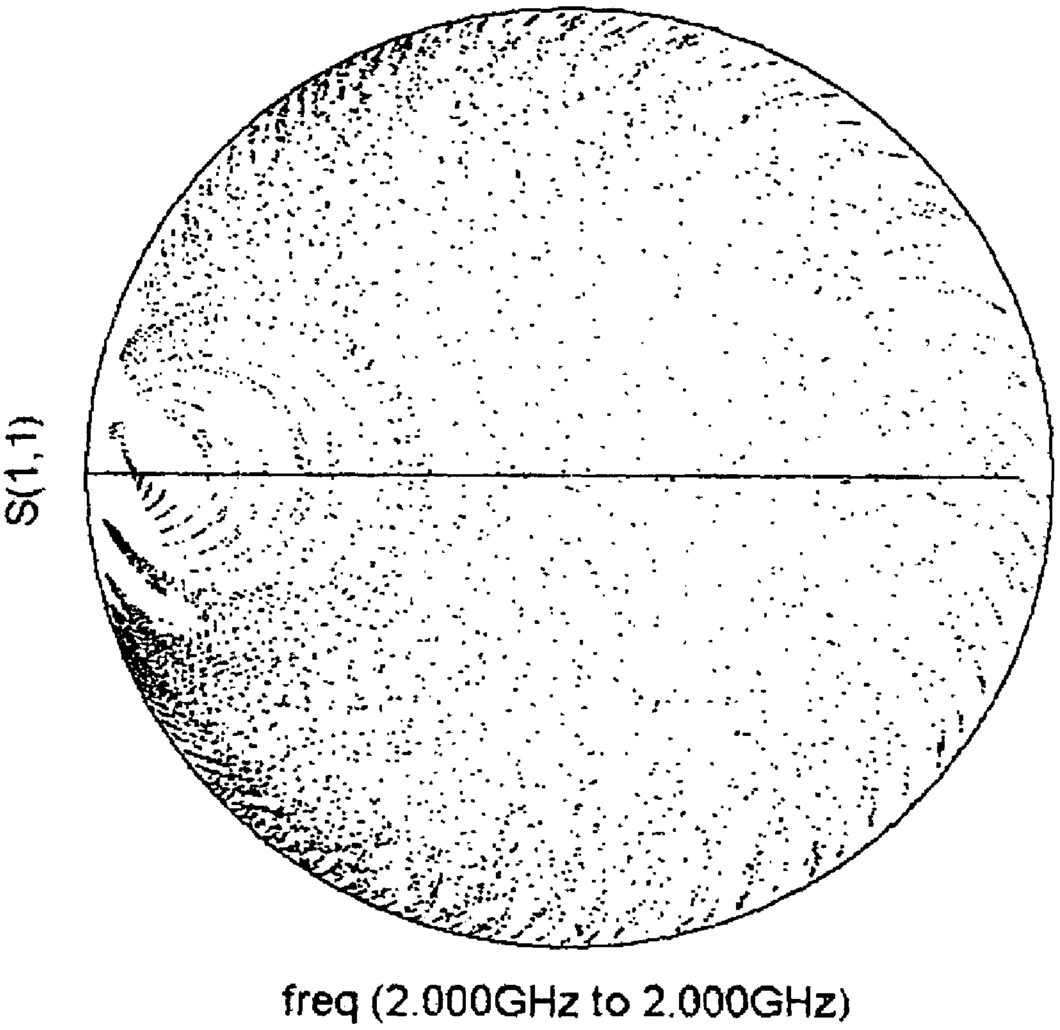
FIG. 23 depicts tuning coverage of the triple probe tuner for an electrical distance between probes 1 and 2 of 45° and between probes 2 and 3 of 90°.

Comparing FIGS. 17–23 we may conclude that, at 2 GHz, the optimum electrical distance between the two probes (or capacitors) is shown in FIGS. 21 and 23. In the case of FIG. 21 the electrical distances are equal L1=L2=90°. In the case of FIG. 23 the electrical distances are L1=45° and L2=90°. The relatively small difference between tuning patterns shows that the concept has validity also over a wider frequency band.

In all cases, even in FIGS. 21 and 23 there is a small area of the Smith Chart, which remains unreachable by the tuner. In real operation, however, the absolute position of the first probe (P1 or C1) determines the starting tuning angle of the pattern. All subsequent tuned positions revolve around this point, shown in all plots as a darker area. Knowing roughly the optimum area to tune for the DUT will allow the operator to pre-set the tuner in such a position and operate around it.

In order to use a triple probe tuner in a load pull or noise measurement setup, it must be calibrated ahead of time. RF two-port parameters (S-parameters) of all permutations of probe positions, both vertical (=capacitance change) and horizontal (change of electrical distance), are included in the tuner calibration files. The calibration procedure is described below.

Figure 24:
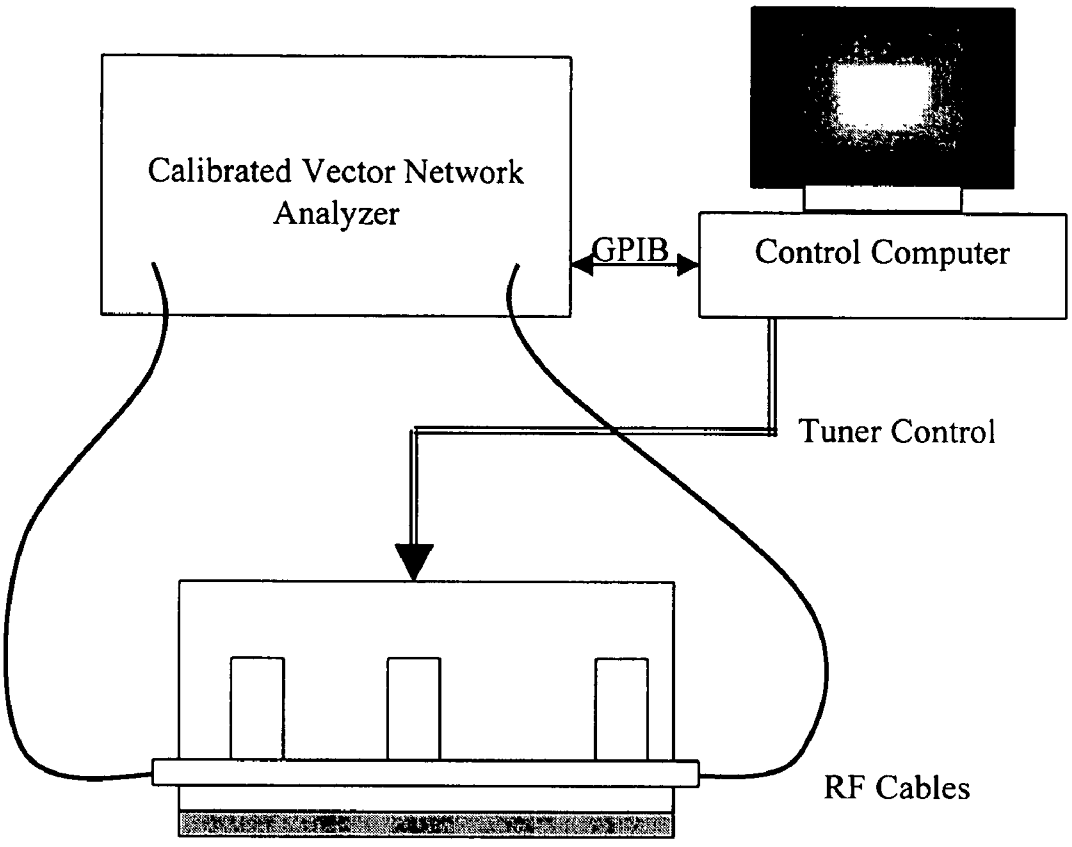
FIG. 24 depicts partly prior art, a typical set-up used to calibrate electromechanical microwave tuners employing a control computer and a calibrated vector network analyzer.

Calibrating the triple probe tuner is effectuated on a previously calibrated vector network analyzer (VNA), (FIG. 24). The tuner is connected by means of good quality RF cables to the VNA ports; a control computer, which also communicates with the VNA via a standard GPIB cable and appropriate software drivers, controls the positions of the three probes.

Calibration of the tuner consists in sending the probes horizontally and vertically to predetermined positions by remote control and reading the two-port S-parameters of the tuner measured by the VNA and save the data on a data file.

The calibration is carried through frequency by frequency. It is a single-frequency (fo) tuner multi-position operation. In order to know also the tuner impedances at the harmonic frequencies 2*fo* and 3*fo* the VNA is tuned to measure at three frequencies fo, 2*fo* and 3*fo* at a time.

The detailed procedure consists of initializing two out of three probes and calibrating the effect of the remaining probe. The vertical positions are selected such as to generate from minimum to maximum capacitive effect on the slabline (corresponding vertical positions 0 to MAX in a number of 20 S11 steps approximately, such as 0, 0.05, 0.1, 0.15, 0.2, 0.25 etc. until roughly 0.95) and the horizontal positions are chosen in order to cover 360° of reflection on the Smith Chart; this corresponds to a total horizontal movement of one half of a wavelength, divided in equal steps for each level of reflection factor, starting with 4 steps at S11=0.05 and ending with 36 steps at S11 between 0.9 and 1.0.

Initialization of each probe is selected as the closest position to the test port, i.e. the port closest to the DUT. In the setup of FIG. 1 the test port of the output tuner is its left port and the test port of the input tuner is its right port. However, a different selection of ports is possible and does not affect the principle of this operation, it only affects the reflection factor at DUT reference plane, following the rule, that, the farther away the RF probe from the tuner test port, the lower the maximum attainable reflection factor of the tuners.

Once the S-parameters of the tuner two-port are collected for all possible permutations of probe positions, they are de-embedded by the two-port matrix of the tuner with the probes initialized. All S-parameter matrices are then cascaded and the calibration result is saved in three data files, one for each harmonic frequency. Different distribution of calibration points and saving formats are possible, but do not affect the principle of the operation and calibration of the described triple-probe tuner. The result of such a calibration data file is shown in FIG. 25.

I claim:

1. An electromechanical, microwave load pull tuner comprising an input (test) and an output (idle) port, a horizontal transmission airline in form of a slotted coaxial or parallel plate airline (slabline), three carriages movable parallel to the airline, which hold one vertically adjustable capacitive probe each and mechanisms for separate remote control of each horizontal and vertical movement of the carriages and probes.

2. An electromechanical tuner as in claim 1, where the adjustable capacitive probes can be independently inserted vertically and positioned at variable distance from the central conductor of the slabline, in order to create an adjustable capacitive load, said position control of the probes being made using stepper motors, which are remotely controlled by a control computer and associated software.

3. An electromechanical tuner as in claim 2, where the adjustable probes can be positioned horizontally fully independently using a horizontal lead screw or belt drive or rack and pinion drive, linked to stepper motors, which are remotely controlled by a control computer and associated software.

4. An electromechanical tuner as in claim 2, where the horizontal position of the probes can be modified in such a way, that the distance between the probes and the test port of the said tuner can be adjusted and allow controlling the phase of the reflection factor presented at the test port of the tuner.

5. An electromechanical tuner as in claim 2, including three independently operating sections, each of which includes one mobile carriage carrying one probe each and associated electric remote motion control.

6. A calibration method for said electromechanical tuner of claim 2, in which scattering parameters (S-parameters) are measured using a calibrated vector network analyzer (VNA) between the test and idle ports of the tuner at a given fundamental frequency of operation and its two harmonics, as a function of a selected number of horizontal and vertical positions of each RF probe, the horizontal positions selected such as to cover 360° of phase at the fundamental frequency and the vertical positions chosen such as to cover from minimum to maximum amplitude of the reflection factor at the test port in five steps, step 1 consisting of measuring S-parameters of the tuner as a function of the positions of probe 1, probes 2 and 3 being initialized, step 2 consisting of measuring S-parameters of the tuner as a function of the positions of probe 2, probes 1 and 3 being initialized, step 3 consisting of measuring S-parameters of the tuner as a function of the positions of probe 3, probes 1 and 2 being initialized, step 4 consisting of cascading the S-parameters measured in steps 2 and 3 with the inverse S-parameter matrix of the tuner, measured when all probes are initialized, and step 5 consisting of saving the S-parameters collected and calculated in steps 1 to 4 in a total of 3 calibration data files, one for each of 3 harmonic frequencies, ready for retrieval.

* * * * *